United States Patent
Kim

(10) Patent No.: US 10,891,994 B2
(45) Date of Patent: *Jan. 12, 2021

(54) SEMICONDUCTOR MEMORY DEVICE FOR INPUTTING AND OUTPUTTING DATA BASED ON DATA STROBE SIGNAL AND OPERATING METHOD THEREOF

(71) Applicant: SK hynix Inc., Gyeonggi-do (KR)

(72) Inventor: Kwang-Soon Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/432,229

(22) Filed: Jun. 5, 2019

(65) Prior Publication Data

US 2020/0143855 A1 May 7, 2020

(30) Foreign Application Priority Data

Nov. 7, 2018 (KR) .................. 10-2018-0135862

(51) Int. Cl.
*G11C 7/22* (2006.01)
*G11C 7/10* (2006.01)
*G11C 29/12* (2006.01)
*G11C 29/36* (2006.01)

(52) U.S. Cl.
CPC .............. *G11C 7/222* (2013.01); *G11C 7/109* (2013.01); *G11C 7/1063* (2013.01); *G11C 7/1096* (2013.01); *G11C 29/12015* (2013.01); *G11C 29/36* (2013.01)

(58) Field of Classification Search
CPC . G11C 7/222; G11C 7/1096; G11C 29/12015; G11C 7/109; G11C 29/36; G11C 7/1063
USPC ...................................... 365/189.15
See application file for complete search history.

(56) References Cited

U.S. PATENT DOCUMENTS

2006/0253663 A1* 11/2006 Johnson ............... G11C 7/1048
711/154
2008/0016420 A1* 1/2008 Chae ...................... G11C 29/16
714/731

FOREIGN PATENT DOCUMENTS

KR 10-2010-0136860 12/2010
KR 10-2015-0145003 12/2015

* cited by examiner

*Primary Examiner* — Tha-O H Bui
(74) *Attorney, Agent, or Firm* — IP & T Group LLP

(57) ABSTRACT

A semiconductor memory device includes: an internal circuit; a write control circuit suitable for writing write data into the internal circuit based on a write strobe signal during a normal write operation, and writing test data into the internal circuit based on a read strobe signal during a test write operation; and a read control circuit suitable for generating the read strobe signal and outputting the read strobe signal together with read data read from the internal circuit during a normal read operation or a test read operation, and generating the read strobe signal and providing the write control circuit with the read strobe signal during the test write operation.

18 Claims, 15 Drawing Sheets

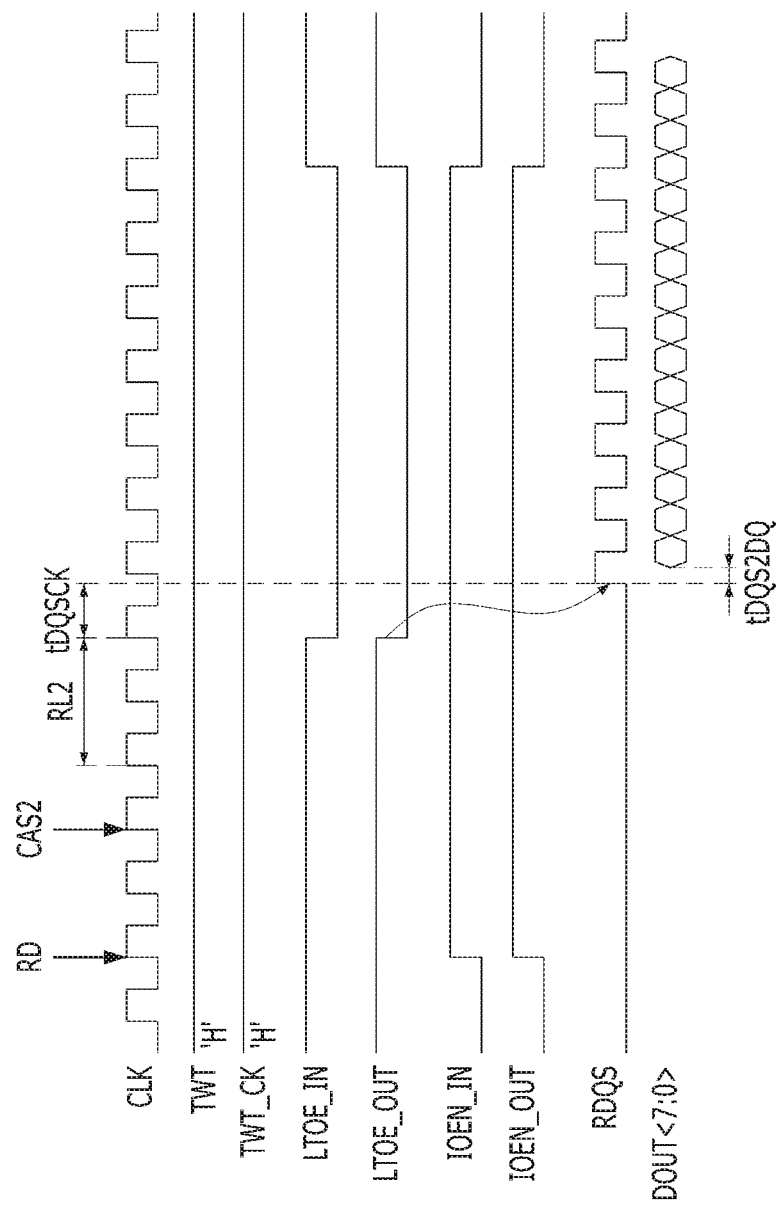

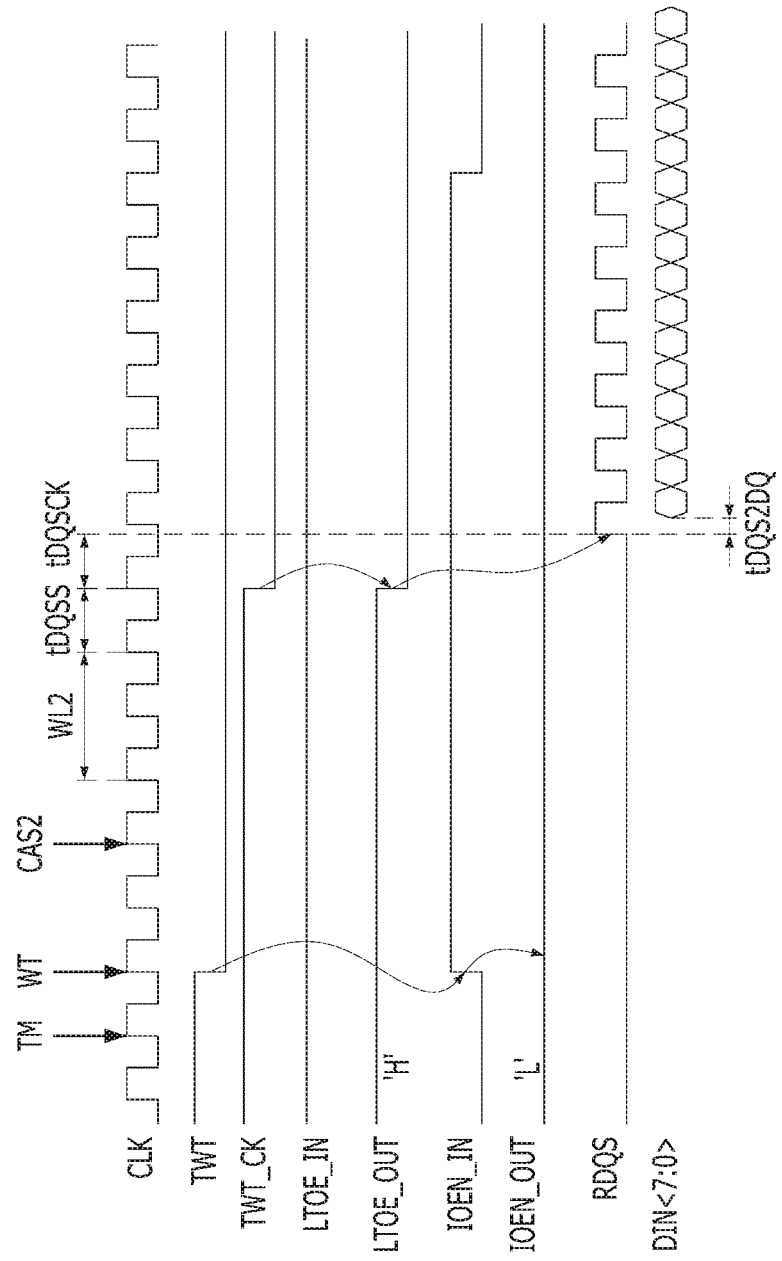

FIG. 14
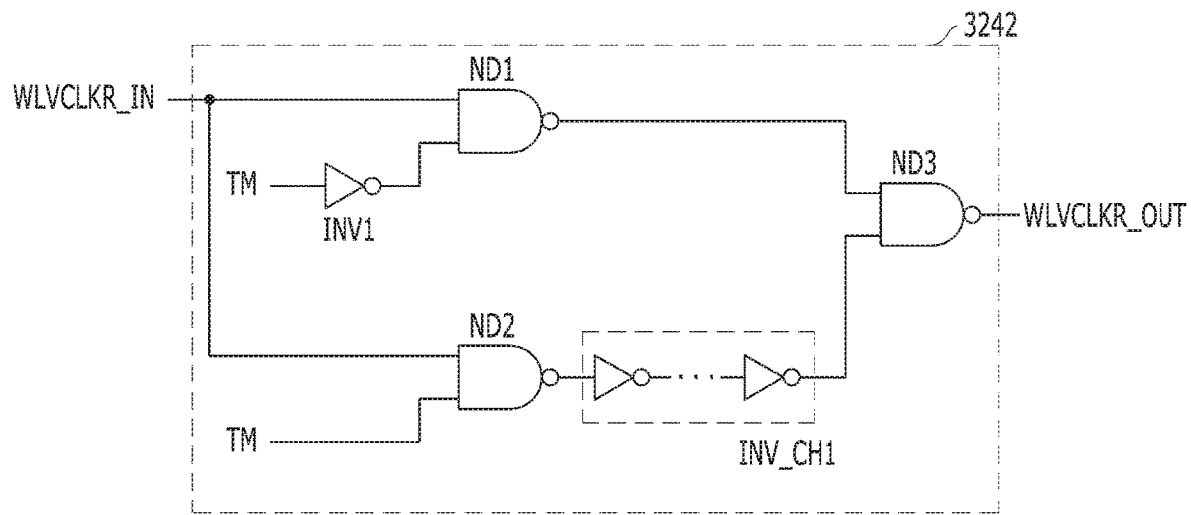
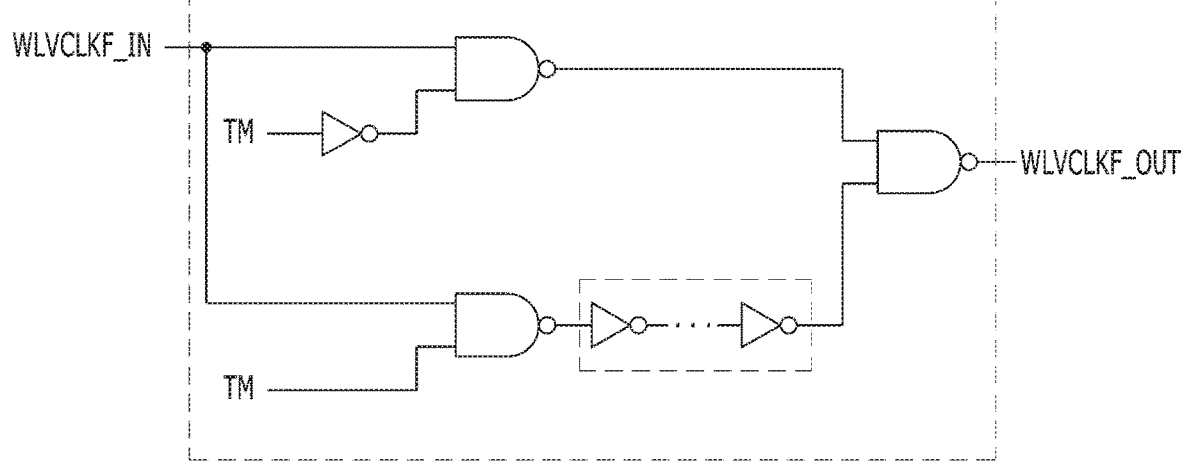

SEMICONDUCTOR MEMORY DEVICE FOR INPUTTING AND OUTPUTTING DATA BASED ON DATA STROBE SIGNAL AND OPERATING METHOD THEREOF

CROSS-REFERENCE TO RELATED APPLICATION

The present application claims priority under 35 U.S.C. § 119(a) to Korean Patent Application No. 10-2018-0135862, filed on Nov. 7, 2018, which is incorporated herein by reference in its entirety.

BACKGROUND

1. Field

Various embodiments of the present invention relate to semiconductor designing technology, and more specifically, to a synchronous memory device for inputting and outputting data based on a data strobe signal.

2. Description of the Related Art

Since a write operation or a read operation of a synchronous memory device is performed in synchronization with a data strobe signal DQS, the synchronous memory device may not properly perform such operation without the input of the data strobe signal DQS.

In a wafer-level test (a wafer test), a probe card for electrical contact with pads (or pins) required for testing each chip is provided to simultaneously test a plurality of chips for each wafer. As the number of pads required for testing each chip decreases, the number of chips to be tested at one time increases, thereby improving the test efficiency. Also, as the number of pads required for testing each chip decreases, test parameters may be reduced along with a decrease in the fabrication cost of the probe card for contacting the pads required for testing each chip. However, in the wafer test, it is necessary to use a DQS pad to test a write operation or a read operation of the synchronous memory device, which results in lowered test efficiency, increased fabrication cost for the probe card, and more test parameters.

SUMMARY

Embodiments of the present invention are directed to a semiconductor memory device capable of being tested without receiving a data strobe signal through a DQS pad, and a method for operating the semiconductor memory device.

In accordance with an embodiment of the present invention, a semiconductor memory device includes: an internal circuit; a write control circuit suitable for writing write data into the internal circuit based on a write strobe signal during a normal write operation, and writing test data into the internal circuit based on a read strobe signal during a test write operation; and a read control circuit suitable for generating the read strobe signal and outputting the read strobe signal together with read data read from the internal circuit during a normal read operation or a test read operation, and generating the read strobe signal and providing the write control circuit with the read strobe signal during the test write operation.

In accordance with another embodiment of the present invention, a method for operating a semiconductor memory device includes: writing write data into an internal circuit based on a write strobe signal during a normal write operation; generating a read strobe signal and outputting the read strobe signal together with read data which is read from the internal circuit during a normal read operation; generating and outputting the read strobe signal and writing test data into the internal circuit based on the read strobe signal during a test write operation; and generating the read strobe signal and outputting the read strobe signal together with read data which is read from the internal circuit during a test read operation.

In accordance with another embodiment of the present invention, a semiconductor memory device includes: an internal circuit; a write control circuit suitable for storing data into the internal circuit based on a read strobe signal; and a read control circuit suitable for providing the write control circuit with the read strobe signal while masking a data enable signal, which is for reading out data from the internal circuit, wherein the read control circuit provides the read strobe signal after a write latency and a first and a second time from input of a write command, wherein the first time represents a skew between a clock and a write strobe signal, and wherein the second time represents a skew between a clock and the read strobe signal.

BRIEF DESCRIPTION OF THE DRAWINGS

FIGS. 11A and 11B are operation waveform diagrams of a read control circuit in accordance with an embodiment of the present invention.

FIG. 14 is a circuit diagram illustrating a test delay reflector, such as that shown in FIG. 13.

DETAILED DESCRIPTION

Figure 1A:
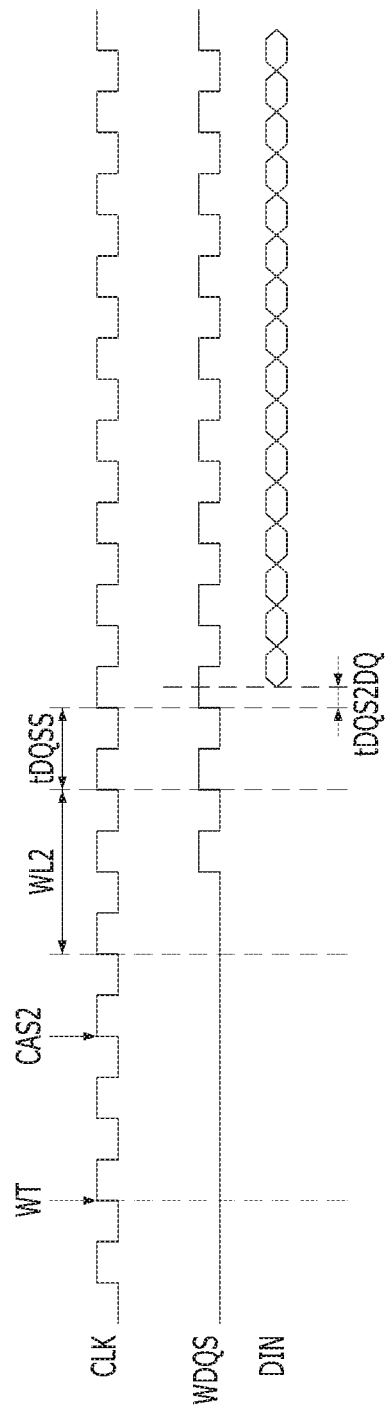
FIGS. 1A and 1B are timing diagrams illustrating a write operation and a read operation of a synchronous memory device.

Various embodiments of the present invention are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Throughout the disclosure, like reference numerals refer to like parts throughout the various figures and embodiments of the present invention. Also, throughout the specification, reference to "an embodiment," "another embodiment" or the like is not necessarily to only one embodiment, and different references to any such phrase are not necessarily to the same embodiment(s).

A write operation and a read operation of a synchronous memory device are described below with reference to the drawings. A case where a write latency WL and the read latency RL are 2tCK (i.e., WL2 and RL2) and the burst length is 16 is described as an example. However, the present invention is not limited to that specific configuration. Rather, concepts of the present invention are applicable to any suitable write and read latencies.

FIG. 1A is a timing diagram illustrating a write operation of a synchronous memory device. In FIG. 1A, a write command WT and a CAS signal CAS2, which is a column-based command, are inputted at a set interval (for example, 2tCK). Also, it is assumed that a write latency WL2 starts 1tCK after the write operation starts.

Referring to FIG. 1A, during a write operation, a write command WT may be inputted to the memory device from an external controller together with a clock CLK, and the CAS signal CAS2 may be inputted 2tCK thereafter. The write latency WL2 starts 1tCK after the CAS signal CAS2 is inputted. When a first time tDQSS passes after completion of the write latency WL2, a write strobe signal WDQS may be inputted. After a strobe-data margin tDQS2DQ passes following input of the write strobe signal WDQS, write data DIN may be inputted. Herein, according to the JEDEC standard, the first time tDQSS may be defined as "Write command to first DQS latching transition", and it may represent skew between the clock and the write strobe signal during a write operation. The strobe-data margin tDQS2DQ may be a delay time of a path that the strobe signal DQS is provided to a latch for latching a data DQ through a delay circuit for timing margin, and the strobe-data margin tDQS2DQ may be defined as skew between the strobe signal and the data.

Figure 1B:
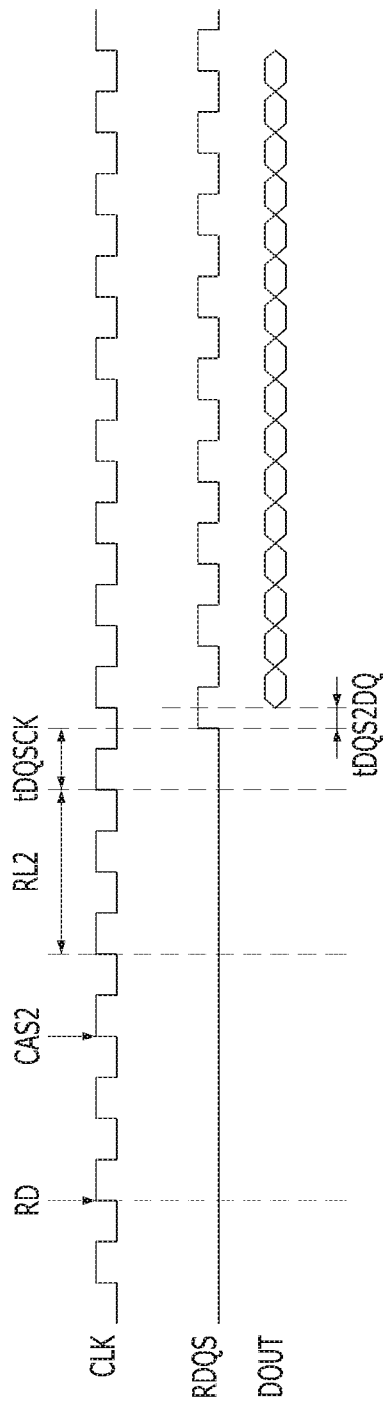

FIG. 1B is a timing diagram illustrating a read operation of the synchronous memory device. In FIG. 1B, a read operation starts when a read command RD and the CAS signal CAS2, which is a column-based command, are inputted at a set interval (for example, 2tCK). Also, it is assumed that a read latency RD2 starts 1tCK after the read operation starts.

Referring to FIG. 1B, during a read operation, a read command RD may be inputted to the memory device from an external controller together with a clock CLK, and the CAS signal CAS2 may be inputted 2tCK thereafter. Accordingly, a cell data (not shown) may be read from a memory cell region of the memory device and transferred to a global input/output line GIO. The read latency RD2 starts 1tCK after CAS signal CAS2 is inputted. When a second time tDQSCK passes after completion of the read latency RD2, a read strobe signal RDQS may be generated and provided to the external controller. After a strobe-data margin tDQS2DQ passes following input of the read strobe signal RDQS, the cell data transferred to the global input/output line GIO may be read and outputted to the external controller as read data DOUT. Herein, according to the JEDEC standard, the second time tDQSCK may be defined as "DQS output access time from CK/CK", and it may represent skew between the clock and the read strobe signal during a read operation.

As described above, the synchronous memory device may receive the write data DIN in synchronization with the write strobe signal WDQS after the write latency WL2 and the first time tDQSS pass from when the write command WT is inputted. Also, the synchronous memory device may output the read data DOUT in synchronization with the read strobe signal RDQS after the read latency RL2 and the second time tDQSCK pass from when the read command RD is inputted.

In the wafer test of the synchronous memory device, it is necessary to use a DQS pad to test a write operation and a read operation of the synchronous memory device. Particularly, during the test of a write operation, the write strobe signal WDQS is inputted continuously to repeatedly input test data, which decreases the test efficiency.

A semiconductor memory device that may be tested without receiving a write strobe signal WDQS through a DQS pad during a wafer test is described below.

Figure 2:
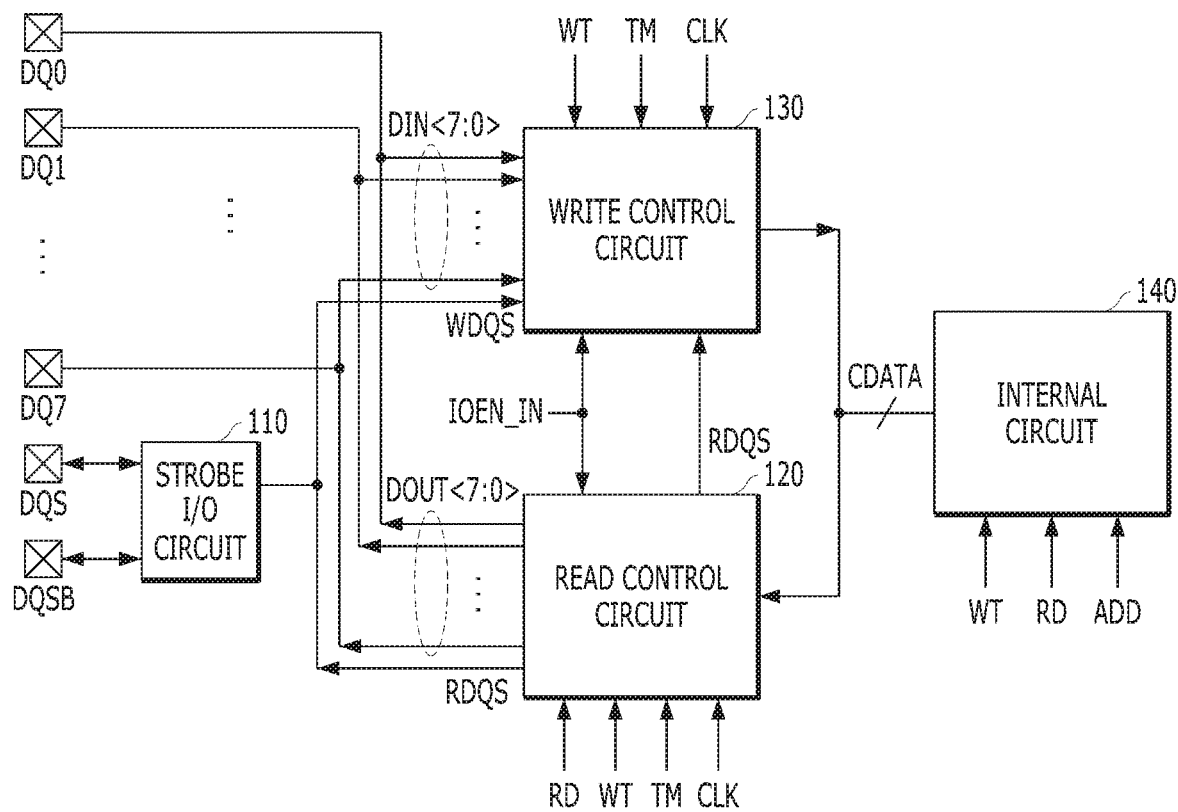
FIG. 2 is a block diagram illustrating a synchronous memory device in accordance with an embodiment of the present invention.
Figure 3:
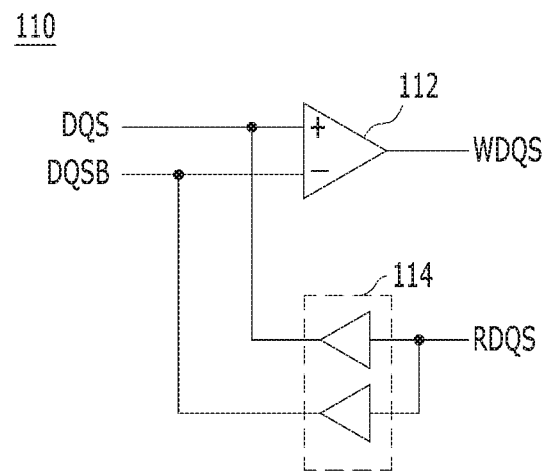
FIG. 3 is a block diagram illustrating a strobe input/output circuit, such as that shown in FIG. 2.

FIG. 2 is a block diagram illustrating a synchronous memory device 100 in accordance with an embodiment of the present invention. FIG. 3 is a block diagram illustrating a strobe input/output circuit 110 shown in FIG. 2.

Referring to FIG. 2, the synchronous memory device 100 may include a plurality of data pads DQ0 to DQ7, differential strobe pads DQS and DQSB, the strobe input/output circuit 110, a read control circuit 120, a write control circuit 130, and an internal circuit 140. The synchronous memory device 100 may further include address/command pads, a clock pad, a command decoder for decoding an address/command signal inputted through the address/command pads, and a clock buffer for buffering a clock inputted through the clock pad. However, these other elements are not described in detail in order to focus on the invention.

A case where the write command WT is inputted while a test mode signal TM is enabled may be defined as 'a test write operation', and a case where the read command RD is inputted while the test mode signal TM is enabled may be defined as 'a test read operation'. Also, a case where the write command WT is inputted while the test mode signal TM is disabled may be defined as 'a normal write operation', and a case where the read command RD is inputted while the test mode signal TM is disabled may be defined as 'a normal read operation'. A write operation may include a test write operation and a normal write operation, and a read operation may include a test read operation and a normal read operation.

The data pads DQ0 to DQ7 may transfer write data DIN<7:0> inputted from an external controller (not shown) to the write control circuit 130 during a write operation, and the data pads DQ0 to DQ7 may output read data DOUT<7:0> provided from the read control circuit 120 to the external controller during a read operation. The write data DIN<7:0> inputted during a test write operation may be defined as 'test data DIN<7:0>'.

The differential strobe pads DQS and DQSB may transfer differential strobe signals inputted from the external controller to the strobe input/output circuit 110 during a write operation, and the differential strobe pads DQS and DQSB may output the differential strobe signals provided from the strobe input/output circuit 110 to the external controller.

Referring to FIG. 3, the strobe input/output circuit 110 may include a comparator 112 for comparing the differential strobe signals provided through the differential strobe pads DQS and DQSB to generate the write strobe signal WDQS, and a buffer 114 for buffering the read strobe signal RDQS provided from the read control circuit 120 to generate the differential strobe signals. The comparator 112 may also generate the write strobe signal WDQS by comparing the differential strobe signals generated by the buffer 114.

Referring back to FIG. 2, during a normal write operation, the write control circuit 130 may write the write data DIN<7:0> into the internal circuit 140 based on the write strobe signal WDQS. During a test write operation, the write control circuit 130 may write the test data DIN<7:0> into the internal circuit 140 based on the read strobe signal RDQS. During the normal write operation, the write control circuit 130 may control the test data DIN<7:0> to be written into the internal circuit 140 after the write latency WL2 and the first time tDQSS pass from when the write command WT is inputted. The first time tDQSS may correspond to the skew between the clock CLK and the write strobe signal WDQS. During the test write operation, the write control circuit 130 may control the test data DIN<7:0> to be written into the internal circuit 140 after the write latency WL2, the first time tDQSS, and the second time tDQSCK pass from when the write command WT is inputted. The second time tDQSCK may correspond to the skew between the clock and the read strobe signal RDQS.

During a normal read operation or a test read operation, the read control circuit 120 may generate the read strobe signal RDQS and output the read strobe signal RDQS together with the read data DOUT<7:0> which is read from the internal circuit 140. Also, during a test write operation, the read control circuit 120 may generate the read strobe signal RDQS and provide the write control circuit 130 with the read strobe signal RDQS, and the read control circuit 120 may control the read data DOUT<7:0> not to be read out by masking a data enable signal IOEN_IN. The data enable signal IOEN_IN may enable the output of the read data DOUT<7:0>. When an active command, e.g., a read command RD or a write command WT, is inputted, the data enable signal IOEN_IN may be enabled to a logic high level. The clock CLK used in the write control circuit 130 and the clock CLK used in the read control circuit 120 and the internal circuit 140 may have a set delay value, which may be predetermined.

During a write operation, the internal circuit 140 may store the write data DIN<7:0> or the test data DIN<7:0> provided from the write control circuit 130 into the memory cells (not shown) designated by an address ADD. During a read operation, the internal circuit 140 may read the read data DOUT<7:0> from the memory cells designated by the address ADD and provide the read control circuit 120 with the read data DOUT<7:0>.

The write operation and the read operation in accordance with embodiments of the present invention are executed as described below.

First, during a normal write operation, the write data DIN<7:0> and the differential strobe signals may be inputted to the memory device 100 from the external controller together with the write command WT and the clock CLK. The strobe input/output circuit 110 may generate the write strobe signal WDQS based on the differential strobe signals. The write control circuit 130 may latch the write data DIN<7:0> inputted serially in response to the write strobe signal WDQS, perform a serial-to-parallel conversion on the latched data in response to the clock CLK so as to produce parallel data, and output the parallel data to the internal circuit 140 as cell data CDATA. The cell data CDATA transferred to the internal circuit 140 may be stored in the memory cells designated by the address ADD.

During a normal read operation, the read command RD and the clock CLK may be provided from the external controller to the memory device 100. The internal circuit 140 may read the cell data CDATA from the memory cells designated by the address ADD and transfer the cell data CDATA to the read control circuit 120. The read control circuit 120 may perform a parallel-to-serial conversion on the cell data CDATA in synchronization with the clock CLK and output the read data DOUT<7:0> through the data pads DQ0 to DQ7. The strobe input/output circuit 110 may buffer the read strobe signal RDQS provided from the read control circuit 120 to generate the differential strobe signals, and output the differential strobe signals externally through the differential strobe pads DQS and DQSB.

The test read operation may be substantially the same as the normal read operation.

During the test write operation, the test mode signal TM, the write command WT, and the clock CLK may be inputted from the external controller into the memory device 100. Herein, the external controller may not provide the write strobe signal WDQS to the memory device 100. Instead, the read control circuit 120 may generate the read strobe signal RDQS based on the test mode signal TM and the write command WT and provide the write control circuit 130 with the read strobe signal RDQS. Herein, the read control circuit 120 may control the read data DOUT<7:0> not to be read out by masking the data enable signal IOEN_IN which enables the output of the read data DOUT<7:0>. The write control circuit 130 may latch the test data DIN<7:0> inputted serially from the controller in response to the read strobe signal RDQS, perform a serial-to-parallel conversion on the latched data in response to the clock CLK so as to produce parallel data, and then provide the internal circuit 140 with the parallel data as cell data CDATA. The cell data CDATA transferred to the internal circuit 140 may be stored in the memory cells designated by the address ADD.

In accordance with an embodiment of the present invention, during the test write operation, since the read strobe signal RDQS is generated in the circuit related to the read operation (i.e., the read control circuit 120), the second time tDQSCK representing the skew between the clock and the read strobe signal RDQS is reflected on the read strobe signal RDQS. On the other hand, the controller may transfer the test data DIN<7:0> according to the first time tDQSS representing the skew between the clock CLK and the write strobe signal WDQS. Therefore, in order to eliminate or minimize the skew during the read operation and the write operation, the read control circuit 120 may generate the read strobe signal RDQS according to the first time tDQSS, and the write control circuit 130 may receive the test data DIN<7:0> according to the second time tDQSCK.

In accordance with an embodiment of the present invention, during the test write operation, the write control circuit 130 may not receive the write strobe signal WDQS from the external controller but receive the test data DIN<7:0> based on an internally generated read strobe signal RDQS. Therefore, since the DQS pad is not used during the wafer test, the number of chips to be tested at one time may increase, which may lead to improved test efficiency.

Figure 4:
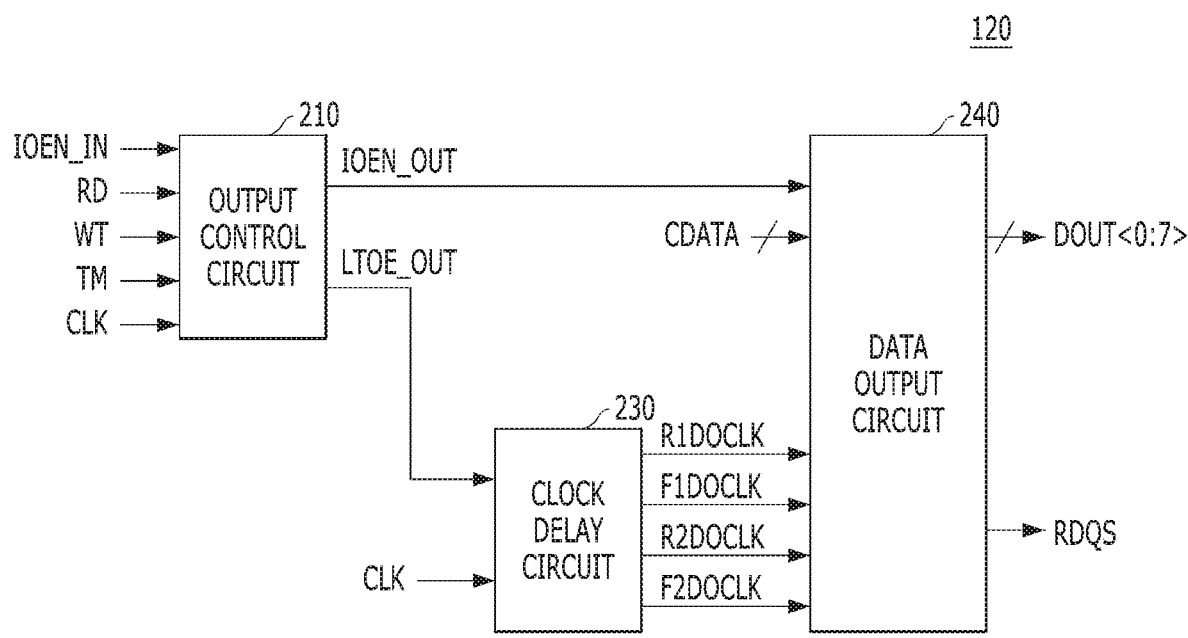
FIG. 4 is a block diagram illustrating a read control circuit, such as that shown in FIG. 2.

FIG. 4 is a block diagram illustrating the read control circuit 120 shown in FIG. 2.

Referring to FIG. 4, the read control circuit 120 may include an output control circuit 210, a clock delay circuit 230, and a data output circuit 240.

The output control circuit 210 may generate a strobe enable signal LTOE_OUT and a final data enable signal IOEN_OUT based on the test mode signal TM, the read command RD, the write command WT, the clock CLK, and the data enable signal IOEN_IN. The output control circuit 210 may enable the strobe enable signal LTOE_OUT based on the read command RD and also enable, while the test mode signal TM is enabled, the strobe enable signal LTOE_OUT based on the write command WT. Also, the output control circuit 210 may output the final data enable signal IOEN_OUT by masking, based on the write command WT while the test mode signal TM is enabled, the data enable signal IOEN_IN so as not to be enabled. In the context of the present description, the data enable signal IOEN_IN and the final data enable signal IOEN_OUT are high active signals enabled to a logic high level and the strobe enable signal LTOE_OUT is a low active signal enabled to a logic low level. However, the present invention is not limited to this, and each of the signals may be realized as a low active signal or a high active signal.

The clock delay circuit 230 may generate first to fourth delay clocks R1DOCLK, F1DOCLK, R2DOCLK and F2DOCLK by delaying the phase of the clock CLK, when the strobe enable signal LTOE_OUT is enabled.

The data output circuit 240 may generate the read strobe signal RDQS by combining the first to fourth delay clocks R1DOCLK, F1DOCLK, R2DOCLK and F2DOCLK, perform a parallel-to-serial conversion on the cell data CDATA based on the final data enable signal IOEN_OUT and the first to fourth delay clocks R1DOCLK, F1DOCLK, R2DOCLK and F2DOCLK, and output the converted cell data CDATA as the read data DOUT<7:0>.

Figure 5:
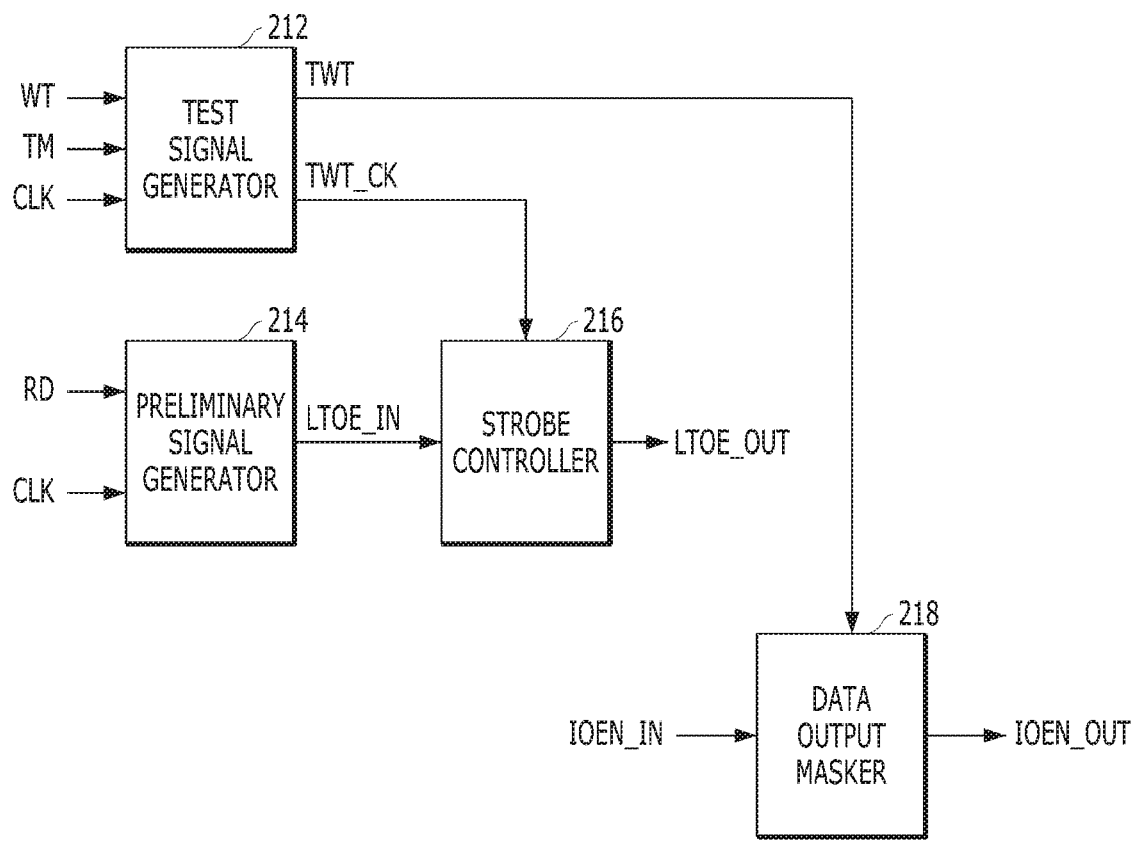
FIG. 5 is a block diagram illustrating an output control circuit, such as that shown in FIG. 4.

FIG. 5 is a block diagram illustrating the output control circuit 210 shown in FIG. 4.

Referring to FIG. 5, the output control circuit 210 may include a test signal generator 212, a preliminary signal generator 214, a strobe controller 216, and a data output masker 218.

The test signal generator 212 may generate a first test signal TWT and a second test signal TWT_CK based on the test mode signal TM, the write command WT, and the clock CLK. When the write command WT is inputted while the test mode signal TM is enabled, the test signal generator 212 may enable the first test signal TWT and enable the second test signal TWT_CK by reflecting the write latency WL2 and the first time tDQSS into the first test signal TWT based on the clock CLK. Hereinafter, it may be assumed that the first test signal TWT and the second test signal TWT_CK are low active signals.

The preliminary signal generator 214 may enable a preliminary enable signal LTOE_IN based on the clock CLK when the read command RD is inputted. The preliminary signal generator 214 may enable the preliminary enable signal LTOE_IN after the read latency RL2 based on the clock CLK when the read command RD is inputted. Herein, when the read command RD and the CAS signal CAS2 are inputted at an interval of 2tCK and the read latency RL2 starts 1tCK after the CAS signal CAS2 is inputted, the preliminary signal generator 214 may enable the preliminary enable signal LTOE_IN after 3 tCK and the read latency RL2 from when the read command RD is enabled. However, this is merely one example; the present invention is not limited to this specific configuration. Also, for the discussion that follows, the preliminary strobe enable signal LTOE_IN is a low active signal.

The strobe control circuit 216 may generate the strobe enable signal LTOE_OUT based on the second test signal TWT_CK and the preliminary enable signal LTOE_IN. The strobe control circuit 216 may enable the strobe enable signal LTOE_OUT when one between the second test signal TWT_CK and the preliminary enable signal LTOE_IN is enabled.

The data output masker 218 may selectively mask the data enable signal IOEN_IN based on the first test signal TWT. The data output masker 218 may output the final data enable signal IOEN_OUT which is disabled to a logic low level by masking the data enable signal IOEN_IN when the first test signal TWT is enabled, and may output the data enable signal IOEN_IN as the final data enable signal IOEN_OUT when the second enable signal TWT is disabled.

Figure 6A:
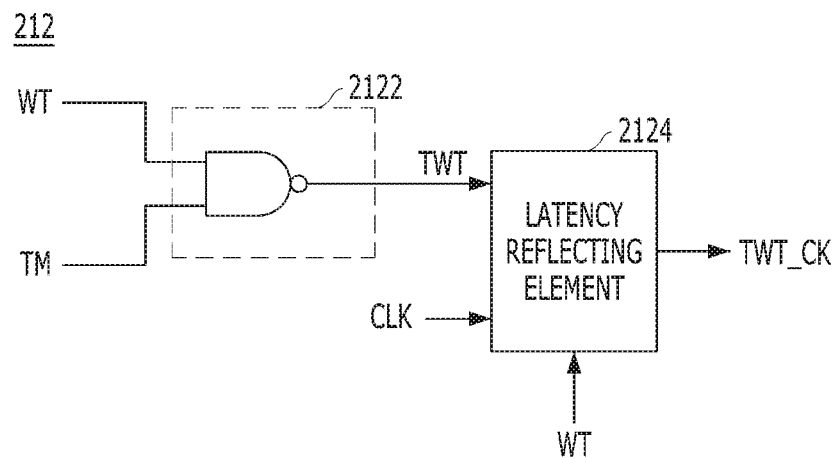
FIGS. 6A and 6B are a circuit diagram and an operation waveform diagram respectively of a test signal generator, such as that shown in FIG. 5.
Figure 6B:
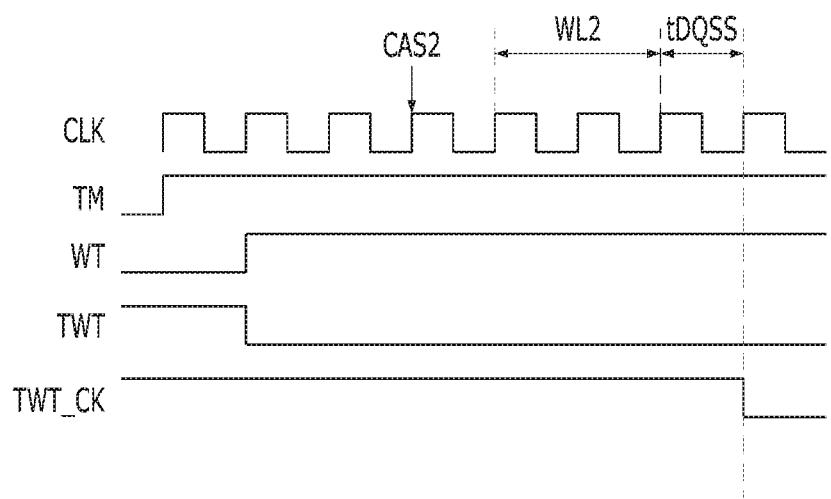

FIGS. 6A and 6B are a circuit diagram and an operation waveform diagram respectively of the test signal generator 212 shown in FIG. 5.

Referring to FIG. 6A, the test signal generator 212 may include a first logic element 2122 and a latency reflecting element 2124.

The first logic element 2122 may output the first test signal TWT by performing a NAND operation on the test mode signal TM and the write command WT. Referring to FIG. 6B, the first logic element 2122 may output the first test signal TWT which is enabled to a logic low level when the test mode signal TM and the write command WT are all in a logic high level. The first logic element 2122 may be realized by a NAND gate, as shown in FIG. 6A, or a combination of logic gates that realize the functionality of a NAND gate.

The latency reflecting element 2124 may reflect the write latency WL2 and the first time tDQSS into the first test signal TWT based on the write command WT and the clock CLK and output the second test signal TWT_CK. Referring to FIG. 6B, the latency reflecting element 2124 may enable the second test signal TWT_CK after the write latency WL2 and the first time tDQSS from when the first test signal TWT is enabled. Referring to FIG. 6B, it is shown that when the write command WT and the CAS signal CAS2 are inputted at an interval of 2tCK, a write operation starts and the write latency WL2 starts 1tCK after the CAS signal CAS2 is inputted. Herein, the latency reflecting element 2124 may enable the second test signal TWT_CK after 3tCK, the write latency WL2, and the first time tDQSS pass from when the first test signal TWT is enabled. However, this is merely one example, and the present invention is not limited to it.

Figure 7A:
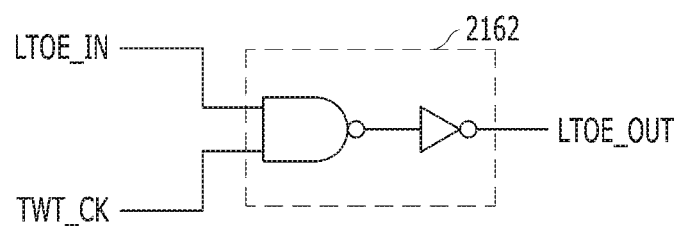
FIGS. 7A and 7B are a circuit diagram and an operation waveform diagram respectively of a strobe controller, such as that shown in FIG. 5.
Figure 7B:
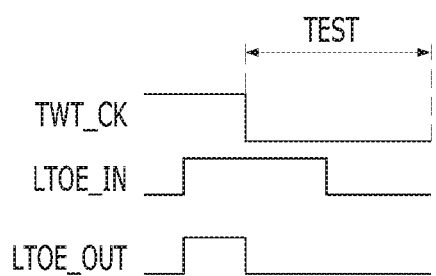

FIGS. 7A and 7B are a circuit diagram and an operation waveform diagram of the strobe controller 216 shown in FIG. 5.

Referring to FIG. 7A, the strobe controller 216 may include a second logic element 2162 for performing an AND operation on the preliminary enable signal LTOE_IN and the second test signal TWT_CK to output the strobe enable signal LTOE_OUT. Referring to FIG. 7B, when one between the second test signal TWT_CK and the preliminary enable signal LTOE_IN is enabled to a logic low level, the second logic element 2162 may output the strobe enable signal LTOE_OUT which is enabled to a logic low level. The second logic element 2162 may be realized by any combination of logic gates that perform an AND operation.

Figure 8A:
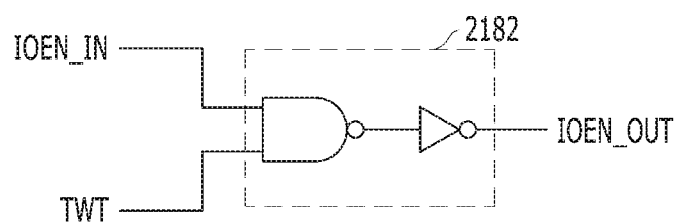
FIGS. 8A and 8B are circuit diagrams of a data output masking circuit, such as that shown in FIG. 5.
Figure 8B:
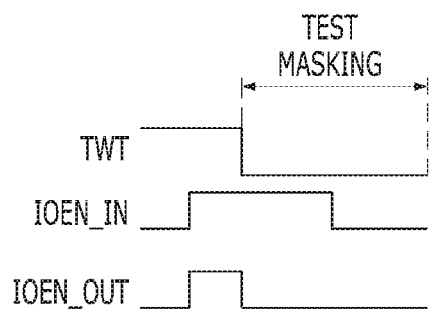

FIGS. 8A and 8B are circuit diagrams of the data output masker 218 shown in FIG. 5.

Referring to FIG. 8A, the data output masker 218 may include a third logic element 2182 for performing an AND operation on the first test signal TWT and the data enable signal IOEN_IN to output the final data enable signal IOEN_OUT. Referring to FIG. 8B, the third logic element 2182 may output the data enable signal IOEN_IN as the final data enable signal IOEN_OUT when the first test signal TWT is disabled to a logic high level, and may output the final data enable signal IOEN_OUT, which is disabled to a logic low level, by masking the data enable signal IOEN_IN when the first test signal TWT is enabled to a logic low level. The third logic element 2182 may be realized by any combination of logic gates that perform an AND operation.

Figure 9:
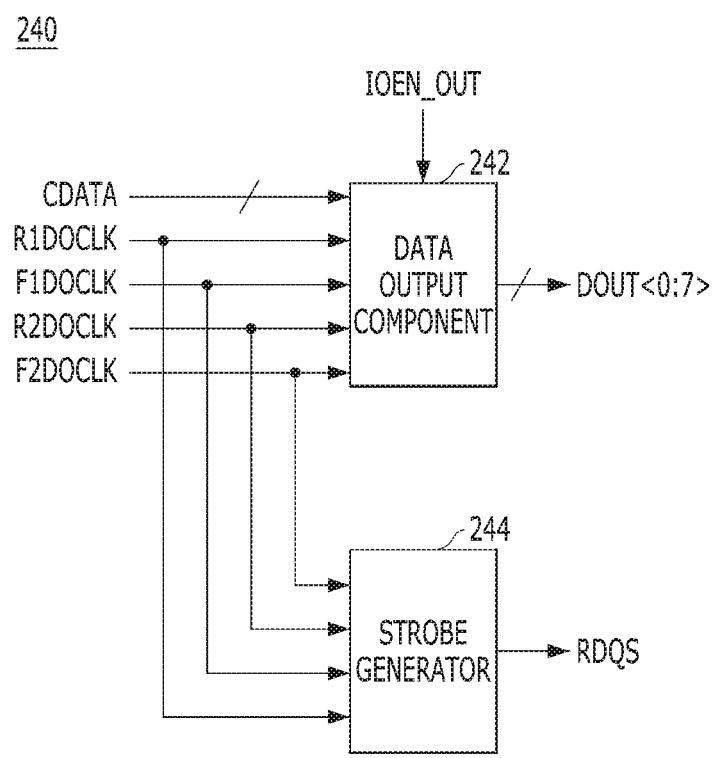
FIG. 9 is a block diagram illustrating a data output circuit, such as that shown in FIG. 4.
Figure 10:
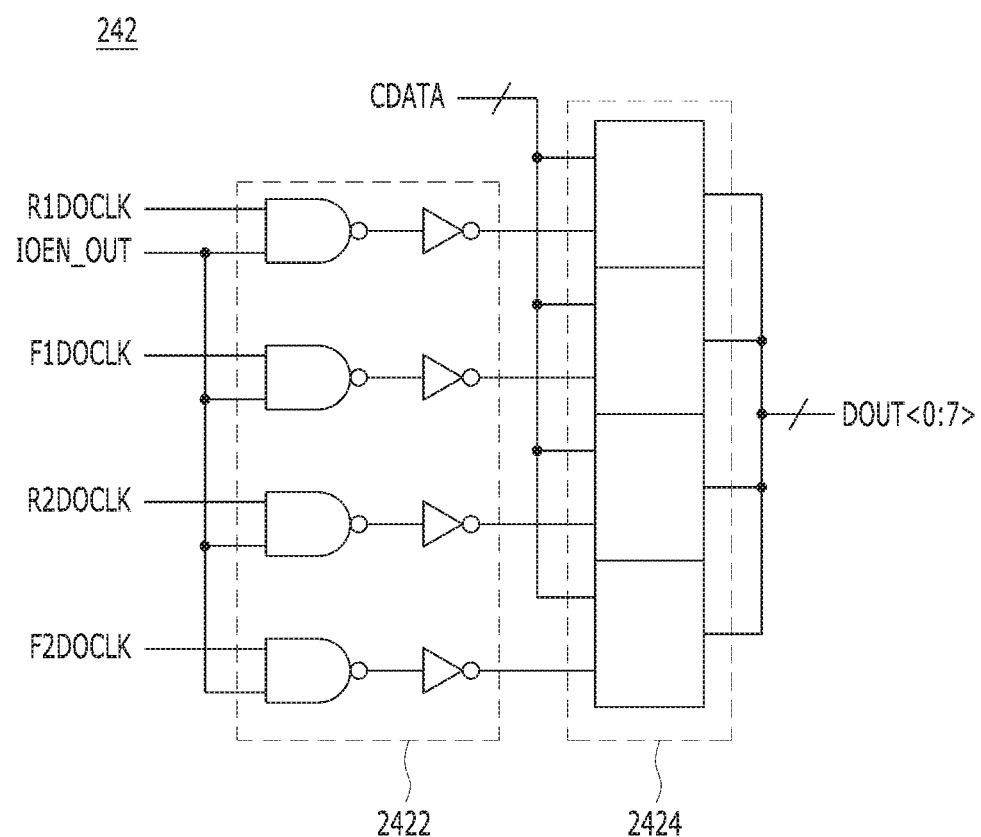
FIG. 10 is a circuit diagram illustrating a data output component, such as that shown in FIG. 9.

FIG. 9 is a block diagram illustrating the data output circuit 240 shown in FIG. 4. FIG. 10 is a circuit diagram illustrating a data output component 242 shown in FIG. 9.

Referring to FIG. 9, the data output circuit 240 may include the data output component 242 and a strobe generator 244.

The data output component 242 may be activated based on the final data enable signal IOEN_OUT, perform a parallel-to-serial conversion on the cell data CDATA based on the first to fourth delay clocks R1DOCLK, F1DOCLK, R2DOCLK and F2DOCLK, and output the converted cell data CDATA as the read data DOUT<7:0>.

Referring to FIG. 10, the data output component 242 may include a transferring element 2422 for transferring the first to fourth delay clocks R1DOCLK, F1DOCLK, R2DOCLK and F2DOCLK based on the final data enable signal IOEN_OUT, and a serializing element 2424 for performing a parallel-to-serial conversion on the cell data CDATA based on the output of the transferring element 2422 and outputting the read data DOUT<7:0>. According to an embodiment of the present invention, the transferring element 2422 may include a plurality of logic elements or gates that perform an AND operation on the final data enable signal IOEN_OUT and one among the first to fourth delay clocks R1DOCLK, F1DOCLK, R2DOCLK and F2DOCLK.

Referring back to FIG. 9, the strobe generator 244 may generate the read strobe signal RDQS by combining the first to fourth delay clocks R1DOCLK, F1DOCLK, R2DOCLK and F2DOCLK. Herein, since crossing occurs between the clock signal domain (which is a CLK domain) and the data strobe signal domain (which is a DQS domain), the strobe generator 244 may have a delay time as much as the second time tDQSCK corresponding to the skew between the clock CLK and the read strobe signal RDQS during a read operation.

The operation of the read control circuit 120 is described below with reference to FIG. 11A of the drawings.

FIG. 11A is a waveform diagram explaining a normal read operation of the read control circuit 120 in accordance with an embodiment of the present invention. Since a test read operation is substantially similar to a normal read operation, detailed description thereof is omitted.

Referring to FIG. 11A, during a normal read operation, the read command RD may be inputted from the external controller to the memory device along with the clock CLK, and the CAS signal CAS2 may be inputted after 2tCK. As a result, the cell data CDATA may be read from the memory cell region of the memory device 100.

The preliminary signal generator 214 of the output control circuit 210 may generate the preliminary enable signal LTOE_IN which is enabled to a logic low level after the read latency RL2 passes 1tCK after the read command RD and the CAS signal CAS2 are inputted. The strobe controller 216 may enable the strobe enable signal LTOE_OUT to a logic low level based on the preliminary enable signal LTOE_IN. The data output masker 218 may output, as the final data enable signal IOEN_OUT, the data enable signal IOEN_IN which is enabled to a logic high level. The clock delay circuit 230 may generate the first to fourth delay clocks R1DOCLK, F1DOCLK, R2DOCLK and F2DOCLK by delaying the phase of the clock CLK when the strobe enable signal LTOE_OUT is enabled. The data output component 242 of the data output circuit 240 may be enabled based on the final data enable signal IOEN_OUT, perform a parallel-to-serial conversion on the cell data CDATA based on the first to fourth delay clocks R1DOCLK, F1DOCLK, R2DOCLK and F2DOCLK, and output the converted cell data CDATA as the read data DOUT<7:0>. The strobe generator 244 may generate the read strobe signal RDQS having a delay time as much as the second time tDQSCK by combining the first to fourth delay clocks R1DOCLK, F1DOCLK, R2DOCLK and F2DOCLK. Herein, the read data DOUT<7:0> may be outputted after the strobe-data margin tDQS2DQ from the read strobe signal RDQS.

As described above, during the normal read operation or the test read operation, the read control circuit 120 may output the read strobe signal RDQS after the read latency RL2 and the second time tDQSCK pass from when the read command RD and the CAS signal CAS2 are inputted, and read out the read data DOUT<7:0> after the strobe-data margin tDQS2DQ from when the read strobe signal RDQS is outputted.

FIG. 11B is a waveform diagram explaining a test write operation of the read control circuit 120 in accordance with an embodiment of the present invention.

Referring to FIG. 11B, during a test write operation, the test mode signal TM, the write command WT, and the clock CLK may be inputted from the external controller to the memory device 100, and the CAS signal CAS2 may be inputted after 2tCK.

The test signal generator 212 of the output control circuit 210 may generate the second test signal TWT_CK by enabling the first test signal TWT and reflecting the write latency WL2 and the first time tDQSS into the first test signal TWT based on the clock CLK. The strobe controller 216 may enable the strobe enable signal LTOE_OUT to a logic low level based on the second test signal TWT_CK. When the strobe enable signal LTOE_OUT is enabled, the clock delay circuit 230 may generate the first to fourth delay clocks R1DOCLK, F1DOCLK, R2DOCLK and F2DOCLK by delaying the phase of the clock CLK. The strobe generator 244 may generate the read strobe signal RDQS having a delay time as much as the second time tDQSCK by combining the first to fourth delay clocks R1DOCLK, F1DOCLK, R2DOCLK and F2DOCLK.

Herein, the data output masker 218 may mask the data enable signal IOEN_IN based on the first test signal TWT and output the final data enable signal IOEN_OUT which is disabled to a logic low level. The data output component 242 may be disabled based on the final data enable signal IOEN_OUT and may not output the read data DOUT<7:0>.

As described above, during the test write operation, the read control circuit 120 may output the read strobe signal RDQS after the write latency WL2, the first time tDQSS, and the second time tDQSCK pass from when the write command WT and the CAS signal CAS2 are inputted.

Figure 12:
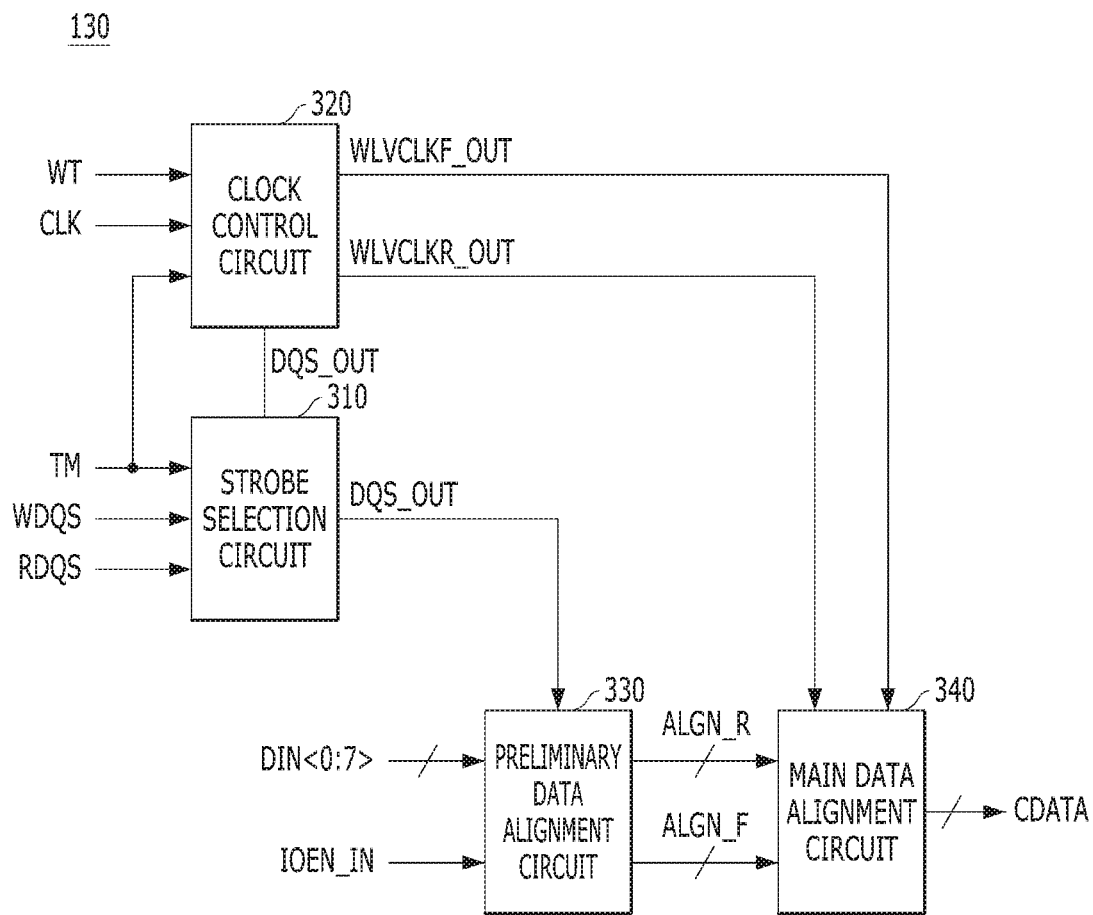
FIG. 12 is a block diagram illustrating a write control circuit, such as that shown in FIG. 2.

FIG. 12 is a block diagram illustrating the write control circuit 130 shown in FIG. 2.

Referring to FIG. 12, the write control circuit 130 may include a strobe selection circuit 310, a clock control circuit 320, a preliminary data alignment circuit 330, and a main data alignment circuit 340.

The strobe selection circuit 310 may select the read strobe signal RDQS or the write strobe signal WDQS based on the test mode signal TM and output a final strobe signal DQS_OUT. The strobe selection circuit 310 may select the read strobe signal RDQS when the test mode signal TM is enabled and may select the write strobe signal WDQS when the test mode signal TM is disabled and output the final strobe signal DQS_OUT.

The clock control circuit 320 may generate first and second write clocks WLVCLKR_OUT and WLVCLKF_OUT based on the write command WT, the clock CLK, and the final strobe signal DQS_OUT, and may selectively delay and output the first and second write clocks WLVCLKR_OUT and WLVCLKF_OUT.

The preliminary data alignment circuit 330 may align the test data DIN<7:0> or the write data DIN<7:0> based on the final strobe signal DQS_OUT and output first and second aligned data ALGN_R and ALGN_F.

The main data alignment circuit 340 may latch the first and second aligned data ALGN_R and ALGN_F based on the first and second write clocks WLVCLKR_OUT and WLVCLKF_OUT and output the cell data CDATA to the internal circuit 140.

Figure 13:
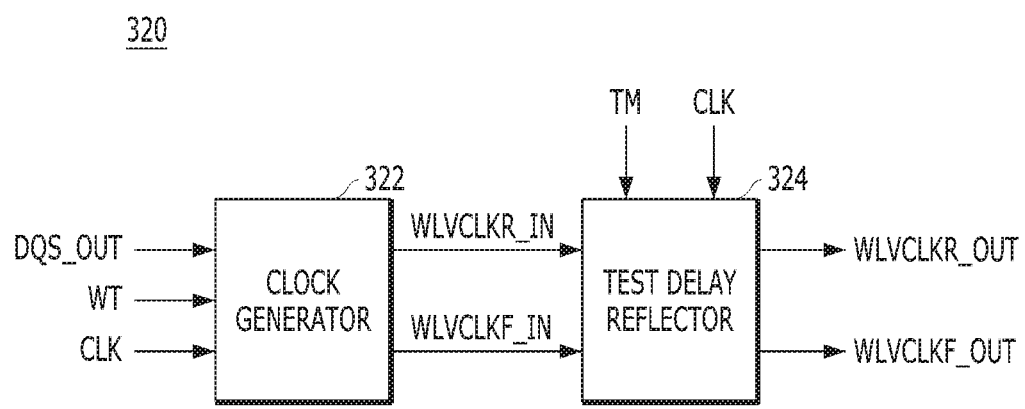
FIG. 13 is a block diagram illustrating a clock controller, such as that shown in FIG. 12.

FIG. 13 is a block diagram illustrating the clock control circuit 320 shown in FIG. 12.

Referring to FIG. 13, the clock control circuit 320 may include a clock generator 322 and a test delay reflector 324.

The clock generator 322 may generate the first and second preliminary write clocks WLVCLKR_IN and WLVCLKF_IN based on the write command WT, the clock CLK, and the final strobe signal DQS_OUT. To be specific, the clock generator 322 may generate the first and second preliminary write clocks WLVCLKR_IN and WLVCLKF_IN based on the clock CLK and the final strobe signal DQS_OUT, when the write command WT is inputted. Herein, since crossing occurs between the data strobe signal domain (which is a DQS domain) and the clock signal domain (which is a CLK domain), the clock generator 322 may have a delay time as much as the first time tDQSS corresponding to the skew between the clock CLK and the write strobe signal WDQS.

The test delay reflector 324 may output the first and second write clocks WLVCLKR_OUT and WLVCLKF_OUT by delaying the first and second preliminary write clocks WLVCLKR_IN and WLVCLKF_IN, when the test mode signal TM is enabled. When the test mode signal TM is disabled, the test delay reflector 324 may output the first and second preliminary write clocks WLVCLKR_IN and WLVCLKF_IN without any substantial delay. When the test mode signal TM is enabled, the test delay reflector 324 may delay the first and second preliminary write clocks WLVCLKR_IN and WLVCLKF_IN by an amount of the second time tDQSCK and output the first and second write clocks WLVCLKR_OUT and WLVCLKF_OUT.

FIG. 14 is a circuit diagram illustrating the test delay reflector 324 shown in FIG. 13.

Referring to FIG. 14, the test delay reflector 324 may include a first delay selection element 3242 and a second delay selection element 3244.

The first delay selection circuit 3242 may include an inverter INV1, first to third NAND gates ND1 to ND3, and an inverter chain INV_CH1.

The inverter INV1 may invert the test mode signal TM. The first NAND gate ND1 may perform a NAND operation on the first preliminary write clock WLVCLKR_IN and the output of the inverter INV1. The second NAND gate ND2 may perform a NAND operation on the first preliminary write clock signal WLVCLKR_IN and the test mode signal TM. The inverter chain INV_CH1 may include an even number of inverters to delay the output of the second NAND gate ND2. The inverter chain INV_CH1 may have a delay time corresponding to the second time tDQSCK. The third NAND gate ND3 may perform a NAND operation on the output of the first NAND gate ND1 and the output of the inverter chain INV_CH1 so as to output the first write clock WLVCLKR_OUT.

With the above-described structure, when the test mode signal TM is disabled, the first delay selection element 3242 may output the first preliminary write clock WLVCLKR_IN without a substantial delay through the path of the first NAND gate ND1 and the third NAND gate ND3. On the other hand, when the test mode signal TM is enabled, the first delay selection element 3242 may delay the first preliminary write clock WLVCLKR_IN by an amount of the second time tDQSCK and output the delay clock through the path of the second NAND gate ND2, the inverter chain INV_CH1, and the third NAND gate ND3.

Since the second delay selection element 3244 has substantially the same structure as the first delay selection element 3242, detailed description thereof is omitted here.

Figure 15:
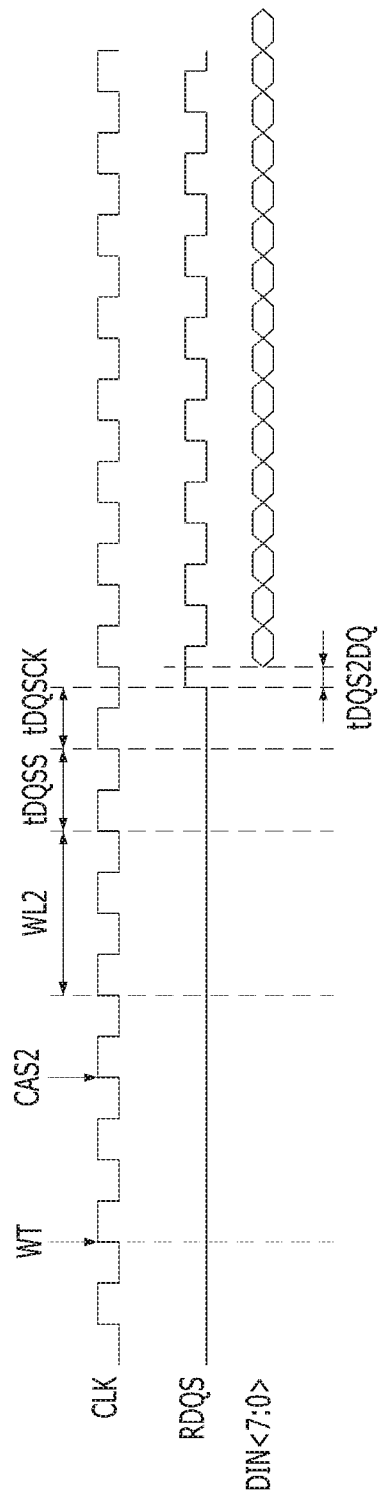
FIG. 15 is a timing diagram illustrating a test write operation of a synchronous semiconductor device in accordance with an embodiment of the present invention.

FIG. 15 is a timing diagram illustrating a test write operation of the synchronous memory device 100 in accordance with an embodiment of the present invention.

Referring to FIG. 15, during a test write operation, the test mode signal TM, the write command WT, and the clock CLK may be inputted to the memory device 100 from an external controller.

The read control circuit 120 may generate the read strobe signal RDQS based on the test mode signal TM and the write command WT and provide the write control circuit 130 with the generated read strobe signal RDQS. Herein, the read control circuit 120 may output the read strobe signal RDQS after the write latency WL2, the first time tDQSS, and the second time tDQSCK pass from when the write command WT and the CAS signal CAS2 are inputted. Since the operation related to this is described above with reference to FIG. 11B, detailed description thereof is omitted here. Also, the read control circuit 120 may control the read data DOUT<7:0> not to be read by masking the data enable signal IOEN_IN for the output of the read data DOUT<7:0>.

When the controller does not provide the memory device 100 with the write strobe signal WDQS, the controller may delay the test data DIN<7:0> by an amount of the second time tDQSCK and then provide the memory device 100 with the delayed data.

The write control circuit 130 may latch the test data DIN<7:0> which is inputted serially in response to the read strobe signal RDQS provided from the read control circuit 120, perform a serial-to-parallel conversion on the latched data in response to the clock CLK, and then transfer the cell data CDATA to the internal circuit 40. The cell data CDATA transferred to the internal circuit 140 may be stored in the memory cells designated by the address ADD.

As described above, during the test write operation, the write control circuit 130 in accordance with embodiments of the present invention may not receive the write strobe signal WDQS from the external controller but receive the test data DIN<7:0> based on an internally generated read strobe signal RDQS. Therefore, since the DQS pad is not used in the wafer test, the number of chips that may be tested at one time may increase, which leads to improved test efficiency.

According to the embodiments of the present invention, as the number of chips that may be tested at one time in the wafer test increases, the semiconductor memory device may have improved test efficiency.

Also, the semiconductor memory device according to the embodiments of the present embodiment may reduce the number of test parameters as well as reducing the cost for fabricating the probe card for contacting the pads required for testing each chip.

While the present invention has been illustrated and described with respect to the specific embodiments, it will be apparent to those skilled in the art in light of the present disclosure that various changes and modifications may be made without departing from the spirit and scope of the invention as defined in the following claims.

For example, the logic gates and transistors may be arranged differently and/or be of different types than illustrated in the above embodiments depending on the polarity of input signals.

What is claimed is:

1. A semiconductor memory device, comprising:
   an internal circuit;
   a write control circuit suitable for writing write data into the internal circuit based on a write strobe signal during a normal write operation, and writing test data into the internal circuit based on a read strobe signal during a test write operation; and
   a read control circuit suitable for generating the read strobe signal and outputting the read strobe signal together with read data read from the internal circuit during a normal read operation or a test read operation, and generating the read strobe signal and providing the write control circuit with the read strobe signal during the test write operation, wherein during the test write operation, the read control circuit masks a data enable signal for enabling the read data to be read.

2. The semiconductor memory device of claim 1, wherein during the normal write operation,
   the write control circuit controls the write data to be written into the internal circuit after a write latency (WL) and a first time (tDQSS), which represents a skew between a clock and the write strobe signal, pass from when a write command is inputted.

3. The semiconductor memory device of claim 1, wherein during the test write operation,
   the write control circuit writes the test data into the internal circuit after a write latency (WL), a first time (tDQSS), which represents a skew between a clock and the write strobe signal, and a second time (tDQSCK), which represents a skew between the clock and the read strobe signal, pass from when a write command is inputted.

4. The semiconductor memory device of claim 1, wherein during the normal read operation or the test read operation, the read control circuit outputs the read strobe signal after a read latency (RL) and a second time (tDQSCK), which represents a skew between a clock and the read strobe signal, pass from when a read command is inputted, and
   during the test write operation, the read control circuit outputs the read strobe signal after a write latency (WL), a first time (tDQSS), which represents a skew between a clock and the write strobe signal, and the second time (tDQSCK) pass from when a write command is inputted.

5. The semiconductor memory device of claim 1, wherein the read control circuit includes:
   an output control circuit suitable for enabling a strobe enable signal based on a read command, enabling the strobe enable signal based on a test mode signal and a write command, and masking the data enable signal for the read data to be read;
   a clock delay circuit suitable for generating a plurality of delay clocks by delaying a phase of a clock when the strobe enable signal is enabled; and
   a data output circuit suitable for generating the read strobe signal by combining the delay clocks and outputting the read data based on the data enable signal and the delay clocks.

6. The semiconductor memory device of claim 5, wherein the output control circuit includes:
   a test signal generator suitable for generating a first test signal based on the test mode signal and the write command, and reflecting the write latency (WL) and the first time (tDQSS), which represents the skew between the clock and the write strobe signal, into the first test signal, and outputting a second test signal;
   a preliminary signal generator suitable for enabling a preliminary enable signal based on the read command;
   a strobe controller suitable for enabling the strobe enable signal based on the second test signal and the preliminary enable signal; and
   a data output masker suitable for masking the data enable signal based on the first test signal.

7. The semiconductor memory device of claim 6, wherein the test signal generator includes:
   a logic element suitable for performing a logical operation on the test mode signal and the write command so as to output the first test signal; and
   a latency reflecting element suitable for reflecting the write latency (WL) and the first time (tDQSS) into the first test signal so as to output the second test signal.

8. The semiconductor memory device of claim 6, wherein the data output circuit includes:
   a data output component enabled based on the data enable signal to output the read data based on the delay clocks; and
   a strobe generator suitable for generating the read strobe signal by combining the delay clocks.

9. The semiconductor memory device of claim 8, wherein the strobe generator has a delay time corresponding to the second time (tDQSCK) which represents a skew between the clock and the read strobe signal.

10. The semiconductor memory device of claim 1, wherein the write control circuit includes:
    a strobe selection circuit suitable for selecting the read strobe signal or the write strobe signal based on a test mode signal and outputting a final strobe signal;
    a clock control circuit suitable for generating a first write clock and a second write clock based on a write command, a clock, and the final strobe signal, selectively delaying the first write clock and the second write clock based on the test mode signal, and outputting a delayed clock;
    a preliminary data alignment circuit suitable for aligning the test data or the write data based on the final strobe signal and outputting a first alignment data and a second alignment data; and
    a main data alignment circuit suitable for outputting the first alignment data and the second alignment data to the internal circuit based on the first write clock and the second write clock.

11. The semiconductor memory device of claim 10, wherein the clock control circuit includes:
    a clock generator suitable for generating a first preliminary write clock and a second preliminary write clock based on the clock and the final strobe signal when the write command is inputted; and a test delay reflector suitable for delaying the first preliminary write clock and the second preliminary write clock and outputting the first write clock and the second write clock when the test mode signal is enabled.

12. The semiconductor memory device of claim 11, wherein the clock generator has a delay time corresponding to a first time (tDQSS) which represents a skew between the clock and the write strobe signal.

13. The semiconductor memory device of claim 11, wherein when the test mode signal is enabled, the test delay reflector delays the first preliminary write clock and the second preliminary write clock by a second time (tDQSCK), which represents a skew between the clock and the read strobe signal, and outputs the first write clock and the second write clock.

14. A method for operating a semiconductor memory device, comprising:
   writing write data into an internal circuit based on a write strobe signal during a normal write operation;
   generating a read strobe signal and outputting the read strobe signal together with read data which is read from the internal circuit during a normal read operation;
   generating and outputting the read strobe signal and writing test data into the internal circuit based on the read strobe signal during a test write operation;
   masking, during the test write operation, a data enable signal for enabling the read data to be read; and
   generating the read strobe signal and outputting the read strobe signal together with read data which is read from the internal circuit during a test read operation.

15. The method of claim 14, wherein the write data is written into the internal circuit after a write latency (WL) and a first time (tDQSS), which represents a skew between a clock and the write strobe signal, pass from when a write command is inputted.

16. The method of claim 14, wherein the test data is written into the internal circuit after a write latency (WL), a first time (tDQSS), which represents a skew between a clock and the write strobe signal, and a second time (tDQSCK), which represents a skew between the clock and the read strobe signal, pass from when a write command is inputted.

17. The method of claim 14,
   wherein the read strobe signal is outputted, during the normal read operation or the test read operation, after a read latency (RL) and a second time (tDQSCK), which represents a skew between a clock and the read strobe signal, pass from when a read command is inputted, and
   wherein the read strobe signal is outputted, during the test write operation, after a write latency (WL), a first time (tDQSS), which represents a skew between a clock and the write strobe signal, and the second time (tDQSCK) pass from when a write command is inputted.

18. A semiconductor memory device comprising:
   an internal circuit;
   a write control circuit suitable for storing data into the internal circuit based on a read strobe signal; and
   a read control circuit suitable for providing the write control circuit with the read strobe signal while masking a data enable signal, which is for reading out data from the internal circuit,
   wherein the read control circuit provides the read strobe signal after a write latency and a first and a second time from input of a write command,
   wherein the first time represents a skew between a clock and a write strobe signal, and
   wherein the second time represents a skew between a clock and the read strobe signal.

* * * * *